(12) United States Patent
Pahl

(10) Patent No.: US 11,492,250 B2
(45) Date of Patent: Nov. 8, 2022

(54) ELECTRONIC DEVICE AND METHOD FOR MANUFACTURING AN ELECTRONIC DEVICE

(71) Applicant: TDK Corporation, Tokyo (JP)

(72) Inventor: Wolfgang Pahl, Munich (DE)

(73) Assignee: TDK CORPORATION, Tokyo (JP)

( * ) Notice: Subject to any disclaimer, the term of this patent is extended or adjusted under 35 U.S.C. 154(b) by 187 days.

(21) Appl. No.: 17/090,737

(22) Filed: Nov. 5, 2020

(65) Prior Publication Data

US 2021/0139317 A1 May 13, 2021

(30) Foreign Application Priority Data

Nov. 8, 2019 (DE) .......................... 102019130209.9

(51) Int. Cl.
| | |
|---|---|
| H01L 23/48 | (2006.01) |
| B81B 7/00 | (2006.01) |
| B81B 3/00 | (2006.01) |
| B81C 1/00 | (2006.01) |
| H01L 23/00 | (2006.01) |

(52) U.S. Cl.
CPC ............ *B81B 7/007* (2013.01); *B81B 3/0021* (2013.01); *B81B 2201/0257* (2013.01); *B81C 1/00301* (2013.01); *H01L 24/14* (2013.01)

(58) Field of Classification Search
CPC .. B81B 7/007; B81B 2201/0257; H01L 24/14
See application file for complete search history.

(56) References Cited

U.S. PATENT DOCUMENTS

| | | |
|---|---|---|
| 6,140,144 A | 10/2000 | Najaf et al. |
| 6,492,194 B1 | 12/2002 | Bureau et al. |
| 6,897,568 B2 | 5/2005 | Haimerl et al. |
| 9,324,586 B2 | 4/2016 | Theuss |
| 9,844,128 B2 | 12/2017 | Pahl et al. |
| 2006/0151203 A1 | 7/2006 | Krueger et al. |
| 2009/0243006 A1 | 10/2009 | Takahashi et al. |
| 2012/0039056 A1 | 2/2012 | Oppermann et al. |
| 2012/0093346 A1 | 4/2012 | Feiertag et al. |
| 2015/0091160 A1 | 4/2015 | Reber |
| 2019/0267318 A1 | 8/2019 | Pahl |

FOREIGN PATENT DOCUMENTS

| | | |
|---|---|---|
| DE | 10016132 A1 | 10/2001 |
| DE | 102010054782 A1 | 6/2012 |
| DE | 102012107403 A1 | 2/2013 |
| DE | 102018104279 A1 | 8/2019 |
| JP | 2009267067 A | 11/2009 |
| WO | 2016165882 A1 | 10/2016 |

*Primary Examiner* — Samuel A Gebremariam
(74) *Attorney, Agent, or Firm* — Slater Matsil, LLP

(57) ABSTRACT

In an embodiment an electronic device includes a carrier board having an upper surface, an electronic chip mounted on the upper surface of the carrier board, the electronic chip having a mounting side facing the upper surface of the carrier board, a flexible mounting layer arranged between the upper surface of the carrier board and the mounting side of the electronic chip, the flexible mounting layer mounting the electronic chip to the carrier board, wherein the mounting side has at least one first region and a second region, and wherein the electronic chip has at least one chip contact element in the first region and at least one connection element arranged on the at least one first region and connecting the at least one chip contact element to the upper surface of the carrier board, wherein the flexible mounting layer separates the second region from the connection element.

18 Claims, 6 Drawing Sheets

ELECTRONIC DEVICE AND METHOD FOR MANUFACTURING AN ELECTRONIC DEVICE

CROSS-REFERENCE TO RELATED APPLICATIONS

This application claims priority to German Application No. 102019130209.9, filed on Nov. 8, 2019, which application is hereby incorporated herein by reference.

TECHNICAL FIELD

At least certain embodiments are related to an electronic device, in particular an electronic device comprising a carrier board and an electronic chip mounted on the carrier board, and to a method for manufacturing the electronic device. The electronic device can be, for instance, a sensor device. In particular, the electronic device can comprise a MEMS (microelectromechanical system) chip. For example, the electronic device can be a MEMS microphone.

BACKGROUND

Generally MEMS microphones make use of microstructured, mostly silicon-based acoustoelectric transducers. These highly sensitive sensor chips have thin moveable membranes, making them also very sensitive to mechanical stress due to the assembly in a protective package and mismatch of different coefficients of the thermal expansion of the various materials. The most common way to keep such stress on a low level is to use a conventional die attach with a soft and thick bondline. In that case, the membrane and thus the electrical contacts are positioned upright seen from the carrier, and the internal electrical interconnections to the package and/or to a complementing ASIC (application-specific integrated circuit) are done by wire bonding. This leads to two major disadvantages: In the case of the dominating bottom port configuration, the MEMS internal cavity cannot contribute to the beneficial acoustic back volume, but adds up to the parasitic front volume, both impairing the performance of the microphone. Moreover, the bond wires require quite a lot of lateral space, for instance for the substrate landings, and headroom, for instance for the wire loop and a safety margin towards the cap, wherein both requirements increase the dimensions of the component, which compromises the general miniaturization efforts.

Flip chip assembly on solder bumps could provide a solution for both said issues. But in this case, in turn, the sensor chip is rigidly coupled to the package substrate, making the sensor chip prone to be influenced by static assembly stress, offset from solder re-melting, temperature induced stress due to CTE mismatch between sensor and package materials, and dynamic stress from external impacts.

SUMMARY

Embodiments provide an electronic device that avoids or at least reduces above-mentioned problems. Further embodiments provide a method for manufacturing the electronic device.

According to at least one embodiment, an electronic device comprises a carrier board having an upper surface. An electronic chip, which can also be denoted in short as "chip" in the following, is mounted on the upper surface of the carrier board. The electronic chip can for example be a sensor chip. In a preferred embodiment, the electronic chip is a MEMS chip.

According to at least one further embodiment, in a method for manufacturing the electronic device the carrier board and the electronic chip are provided. In particular, the electronic chip is provided for being mounted on the carrier board. The embodiments and features described before and in the following equally apply to the electronic device and to the method for manufacturing the electronic device.

According to a further embodiment, the carrier board provides electrical connections for connecting the electronic chip. In particular, the carrier board can be a laminated multilayer board, which can be based on HTCC (high temperature co-fired ceramic), LTCC (low temperature co-fired ceramic), organic materials such as polymer materials and/or glass. Conductor lines and/or vias can provide electrical routing between the elements mounted on the carrier board and external solder pads.

The electronic chip preferably has a mounting side facing the upper surface of the carrier board when being mounted on the carrier board. Furthermore, the electronic chip can have a top side facing away from the upper surface of the carrier board and sidewalls connecting the mounting side to the top side. The mounting side can have at least one first region and a second region. In particular, the chip can have at least one chip contact element in the first region, the chip contact element embodied for electrical connecting the chip to the upper surface of the carrier board. Preferably, the chip has a plurality of first regions, wherein in each first region there is at least one chip contact element. Accordingly, the electronic chip preferably comprises a plurality of chip contact elements and a plurality of first regions, wherein in each first region at least one chip contact element is located.

Furthermore, each of the one or more chip contact elements of the electronic chip comprises or is embodied as contact pad and/or stud bump. A contact pad can for instance be an electrode pad of the electronic chip. A stud bump can for example be located on an electrode pad or another superficial conductor element of the electronic chip. To create a stud bump, a metal ball, for example comprising or consisting of gold, is formed using a standard wire bonding process. After the ball is bonded to the electrode pad, wire clamps are closed and the bondhead moves to tear the wire. If the movement direction is directed substantially perpendicular to the mounting side, a "tail" can be left on top of the bump. Depending on the movement parameters, the width and the length of the tail and, thus, the size and shape of the stud bump can be adjusted.

According to a further embodiment, the carrier board has at least one carrier contact element, wherein the at least one carrier contact element preferably comprises a contact pad and/or a stud bump. In particular, the carrier board can comprise a dedicated carrier contact element for each of the chip contact elements. Additionally, the carrier board can comprise carrier contact elements for electrically connecting additional electronic components such as, for instance, an ASIC.

According to a further embodiment, the electronic device comprises at least one connection element that connects the at least one chip contact element to the upper side of the carrier board. Accordingly, the at least one connection element is arranged on the at least one first region of the mounting side of the electronic chip. Preferably, the at least one connection element connects the at least one chip contact element to the at least one carrier contact element. In particular, each of the chip contact elements is connected to a carrier contact element by means of a connection element. The at least one connection element is preferably electrically conducting. For manufacturing the electronic device, a connection material is preferably arranged on the upper surface of the carrier board or on the at least one first region of the electronic chip. For instance, the connection material comprises an electrically conducting adhesive. In particular, the connection material can be cured and the connection element can be formed, which then preferably comprises or is made of a cured electrically conductive adhesive.

Preferably, the at least one connection element is made of a material with a Young's modulus of equal to or less than 300 MPa, and preferably of equal to or less than 100 MPa. In particular, the at least one connection element can be made of a material with said Young's modulus in a temperature range between at least −20° C. and 100° C., including the limits, and preferably between at least −40° C. and 120° C., including the limits. The at least one connection element can comprise or be a flexible adhesive, for instance a silicone, filled with conductive particles, for instance silver particles or carbon black particles, and/or an intrinsically conductive polymer.

According to a further embodiment, the electronic device comprises a flexible mounting layer. The flexible mounting layer is arranged between the upper surface of the carrier board and the mounting side of the electronic chip. The feature "flexible" relates to mechanical properties specified below. In particular, the mounting layer mounts the electronic chip to the carrier board. This can preferably mean that the electronic chip and, in particular, a part of the mounting side is mounted to a part of the upper surface of the carrier board. The mounting layer can preferably be in direct contact to a part of the mounting side or to a part of the upper surface of the carrier board or, particularly preferably, to both.

According to a further embodiment, for manufacturing the electronic device a mounting material is applied to at least a part of the upper surface of the carrier board or to at least a part of the mounting side of the electronic chip. The mounting material is applied in a structured way to form the flexible mounting layer. For instance, the mounting material can be applied as a continuous layer to the complete upper surface of the carrier board or to a part thereof or to the complete mounting side of the electronic chip or a part thereof. Afterwards, the mounting material can be selectively removed and thus structured to receive the desired pattern. The structuring can be performed, for instance, by using one or more of laser ablation, photolithography, cutting, peeling. The mounting material can also be deposited as curable viscous material using additive patterning, for instance printing such as 3D printing, or subtractive patterning, for instance lithography. Depending on the mounting material the patterned mounting material can be partly or completely cured to form the mounting layer, or the patterned mounting material can already form the mounting layer without an additional curing step. The curing, if required, can be performed before or preferably after the chip is mounted on the carrier board. It can also be possible to manufacture and, in particular, structure the mounting layer separate from the chip and the carrier board and to apply the mounting layer in an already structured form.

After arranging the mounting material or the mounting layer on the electronic chip or on the carrier board, the electronic chip is arranged on the carrier board so that the mounting side of the electronic chip faces the upper surface of the carrier board. The mounting layer can mount the electronic chip on the carrier board so that the electronic chip is fixed to the carrier board at least partly or preferably substantially by means of the mounting layer.

According to a further embodiment, the mounting layer adheres to the mounting side of the electronic chip or to the upper surface of the carrier board or, preferably, to both. For instance, the mounting layer has intrinsic bonding capabilities, i.e., the mounting material and, in particular, the mounting layer in the finished electronic device can directly adhere to the adjacent material of the electronic chip and/or the carrier board. This can imply that the mounting layer has at least superficial bonding capabilities by means of an adhesive surface. Alternatively, the mounting layer can comprise an adhesive layer on one of the surfaces adjacent to the chip and to the carrier board or on both said surfaces.

According to a further embodiment, the mounting layer comprises a polymer material. Preferably, the mounting layer is made of a material with a Young's modulus of equal to or greater than 0.5 MPa and equal to or less than 100 MPa, and preferably of equal to or greater than 3 MPa and equal to or less than 30 MPa. Particularly preferably, the mounting layer is made of a material with said Young's modulus in a temperature range between at least −20° C. and 100° C., including the limits, and preferably between at least −40° C. and 120° C., including the limits. Furthermore, the mounting layer can have a thickness of equal to or greater than 10 μm and equal to or less than 500 μm. It can be particularly preferable if the mounting layer has said flexibility and, at the same time, is tacky and inherently stable. For example, the mounting layer comprises or is made of a silicone-based polymer, for instance an ultra-low stress silicone polymer, or a soft B-stage epoxy material, wherein the B-stage epoxy material can be in a cured state in the finished electronic device, which is sometimes referred to as C-stage.

According to a further embodiment, the flexible mounting layer separates the second region of the mounting side of the electronic chip from the connection element on the at least one first region. In particular, the material of the mounting layer can be arranged between the at least one first region and the second region, acting as a barrier or dam and preventing the material of the connection element from spilling, squeezing, smearing or bleeding from the at least one first region onto the second region of the mounting side during manufacture and in the finished electronic device. Particularly preferably, the second region can be surrounded by the by mounting layer. In other words, the mounting layer can have an opening in the form of a through-hole, through which the second region is accessible. Furthermore, each of the at least one connection element can be arranged in an opening, for instance a through-hole, in the mounting layer. Accordingly, the mounting side in the second region is preferably free of the at least one connection element and of the mounting layer.

According to a further embodiment, the mounting side of the electronic chip is located at a distance from the upper surface of the carrier board, thereby defining a clearance between the second region of the mounting side and the upper surface. The height of the clearance can be determined substantially by the thickness of the mounting layer. In particular, the clearance can be free of any underfill material. In other words, the electronic chip can be mounted and fixed on the carrier board only or at least substantially by means of the mounting layer and the at least one connection element, wherein any further underfill material, as for example adhesive materials that are often applied between a chip and a substrate, can be avoided.

For instance, the electronic chip has an active sensor element in the second region. In case the electronic chip is a microphone chip, the chip can comprise at least a membrane and/or a back plate in the second region. Due to the structured mounting layer the chip is mounted on the carrier board and, at the same time, the membrane is kept free of the at least one connection element. The carrier board can have an opening, for instance forming an acoustic port, opposite to the second region. Furthermore, the flexible mounting layer can provide an acoustic seal between the mounting side and the top side of the electronic chip.

BRIEF DESCRIPTION OF THE DRAWINGS

Further features, advantages and expediencies will become apparent from the following description of exemplary embodiments in conjunction with the figures.

In the figures, elements of the same design and/or function are identified by the same reference numerals. It is to be understood that the embodiments shown in the figures are illustrative representations and are not necessarily drawn to scale.

DETAILED DESCRIPTION OF ILLUSTRATIVE EMBODIMENTS

FIGS. 1 to 13 show method steps of a method for manufacturing an electronic device wo according to several embodiments. As can be seen for instance in FIG. 7, the electronic device wo comprises a carrier board 1 on which an electronic chip 2 is mounted. The electronic chip 2 can for example be a sensor chip and, preferably, a MEMS chip such as a MEMS microphone. Although the following description is related to such application, the embodiments are not limited to MEMS microphones, but can also be useful for other types of stress sensitive sensors as well as electronic components in general.

Although in the Figures as well as in the general part above the various embodiments of the electronic device and the method for manufacturing the electronic device are described in connection with a single electronic device, the method for manufacturing the electronic device can be panel-based, so that a multiplicity, typically several hundreds, of single electronic devices can be manufactured on one integral carrier-board substrate, which is singulated for instance in one of the last method steps into individual electronic devices, each having an electronic chip on a carrier board.

Figure 1:
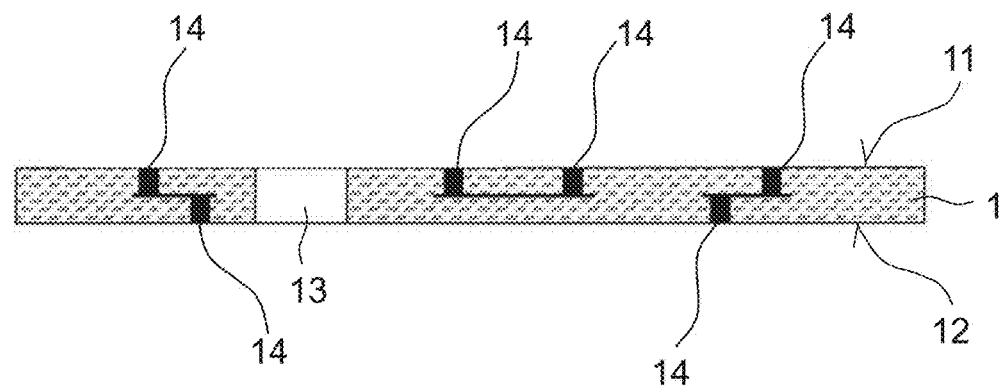
FIGS. 1 to 13 show schematic illustrations of method steps of a method for manufacturing an electronic device as well as an electronic device according to several embodiments.

As shown in FIG. 1, a laminated multilayer board, for example based on HTCC, LTCC, polymer or glass, is provided as the carrier board 1 and, thus, as a package substrate. The carrier board 1 comprises an upper surface 11 and a lower surface 12 remote from the upper surface 11. Furthermore, the carrier board 1 has an opening 13 reaching from the upper surface 11 to the lower surface 12, which acts as a sound port opening in the finished electronic device. For applications other than microphone applications, the opening 13 can also be omitted. On the upper and the lower surface 11, 12, the carrier board 1 has carrier contact elements 14, which can be formed as contact pads. Conductor lines and vias provide electrical routing between the carrier contact elements 14. Ground planes (not shown) can improve electromagnetic shielding in combination with a cap, preferably a metal cap, attached to the carrier board 1 by means of a suitable connection material, for example a solder or a conductive adhesive, as for instance shown in FIG. 15.

Figure 2:
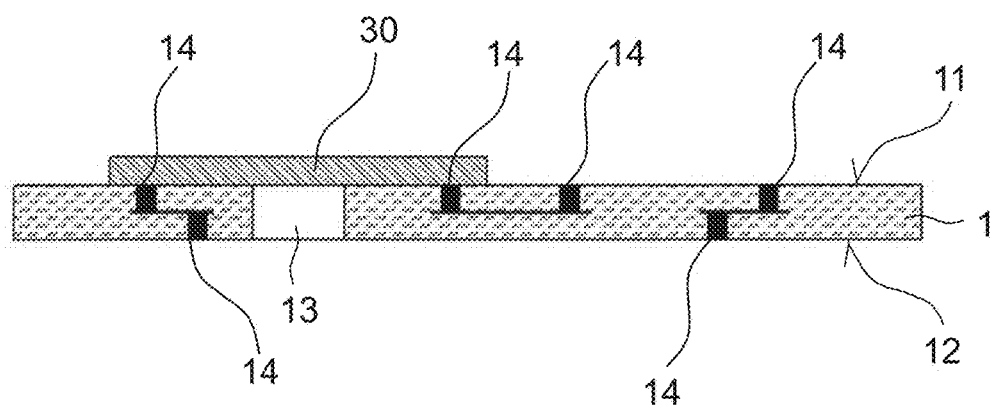
Figure 3:
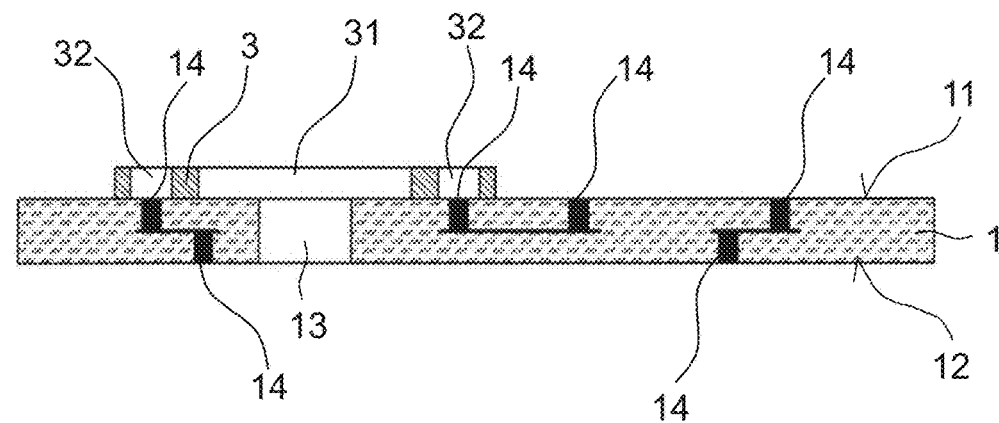

In a further method step, as illustrated in FIG. 2, a mounting material 30 is applied to the upper surface 11 of the carrier board 1 for manufacturing a flexible mounting layer 3 that can be seen in FIG. 3. As shown, the mounting material 30 can be applied as a partial layer in that region of the upper surface 11, in which the electronic chip will be mounted later. The mounting material 30 is preferably applied directly to the upper surface 11, i.e., in direct contact with the upper surface 11 of the carrier board 1. In particular, the mounting material 30 is a polymer material. The mounting material 30 and, in particular, the mounting layer 3 preferably has a thickness of equal to or greater than 10 μm and equal to or less than 500 μm.

The polymer material used as mounting material 30 and thus for the mounting layer 3 has preferably a Young's modulus of equal to or greater than 0.5 MPa and equal to or less than 100 MPa, and preferably of equal to or greater than 3 MPa and equal to or less than 30 MPa, over a wide temperature range, thus providing sufficient flexibility. Particularly preferably, the mounting layer 3 has said Young's modulus in a temperature range between at least −20° C. and 100° C., including the limits, and preferably between at least −40° C. and 120° C., including the limits. For example, the polymer material and thus the mounting layer comprises or is made of a silicone-based polymer, for instance an ultra-low stress silicone polymer, or a soft B-stage epoxy material or a C-stage epoxy material. The mounting material 30 and, in particular, the mounting layer 3 can have superficial and/or intrinsic bonding capabilities and thus can adhere to the upper surface 11 of the carrier board 1. It can be also possible that the mounting layer 3 comprises an adhesive layer on the surface facing the carrier board 1 and/or on the surface remote from the carrier board 1.

Figure 4:
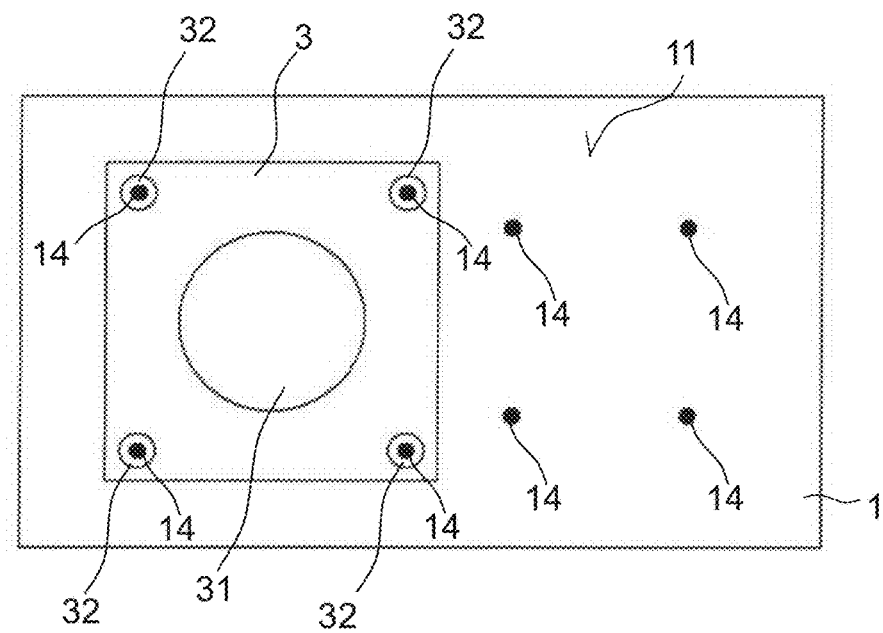

As shown in FIG. 3, the mounting material is structured in such way that the opening 13 and carrier contact elements 14 of the carrier board 1 are exposed by forming openings 31, 32 by selective removal of mounting material. FIG. 4 shows a corresponding top view onto the upper surface 11 of the carrier board 1. The structuring can be performed by using, for instance, photolithography or laser ablation or any other method suitable for selectively removing mounting material. Depending on the polymer material, the mounting layer 3 can be finished after the structuring, as shown in FIG. 3. Alternatively, it can be possible that the mounting material is partially or completely cured to form the mounting layer 3, wherein the curing is performed immediately after the structuring step or after one of the later method steps described in the following.

Figure 5:
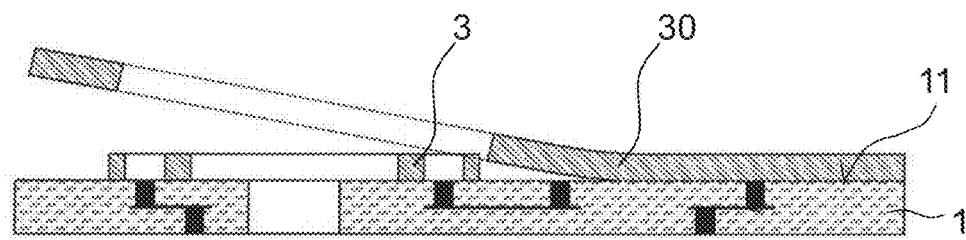

It is also possible to attach the mounting material 30 to the complete upper surface 11 of the carrier board 1, followed by more extensive removal. As illustrated in FIG. 5, this can be done for example in combination with cut and peel. The layer can also be deposited as curable viscous polymer material using additive patterning as, for instance 3D printing, or subtractive patterning as, for instance, lithography. Another possibility is to structure the mounting layer 3 separately from the carrier board 1 and to attach the mounting layer 3 in already structured form.

Figure 6:
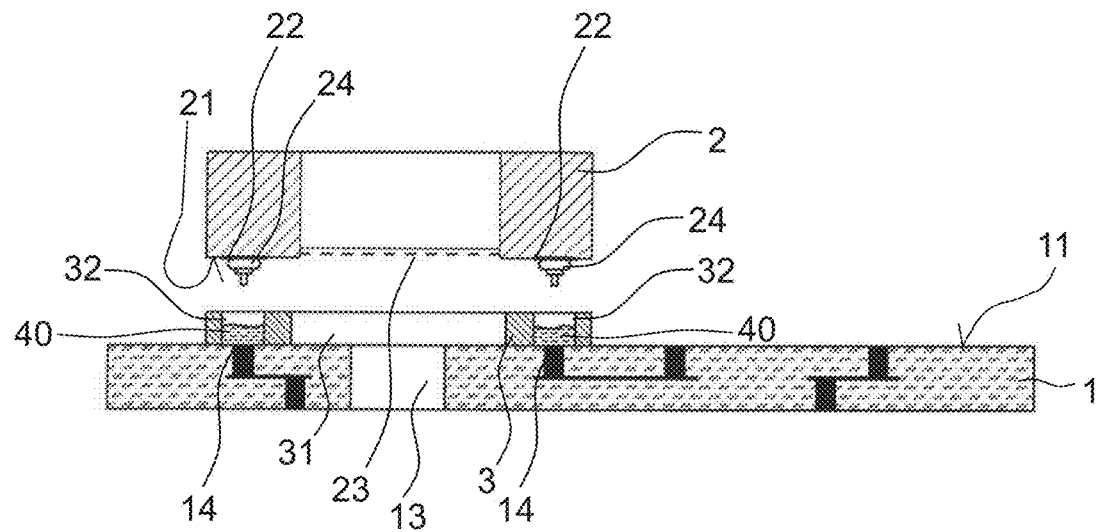

In a following method step, as shown in FIG. 6, the electronic chip 2 is provided for being mounted on the carrier board 1 using the mounting layer 3 as a flexible assembly frame. The electronic chip 2 has a mounting side 21 facing the upper surface 11 of the carrier board 1. Furthermore, the electronic chip 2 has a top side facing away from the upper surface 11, and sidewalls connecting the mounting side 21 to the top side. The mounting side 21 of the chip 2 has at least one first region 22 and a second region 23. As shown, the chip 2 can have at least one chip contact element 24 in the at least one first region 21, wherein the chip contact element 24 is embodied for electrically connecting the chip 2 to the upper surface 11 of the carrier board 1, in particular by means of a connecting material. Preferably, the chip 2 has a plurality of first regions 22, wherein in each first region 22 there is at least one chip contact element 24. In the second region 23 the chip 2, which, as explained above, is embodied as a MEMS microphone chip in the shown embodiments, has a membrane and a back plate. The electronic chip 2 is provided to be mounted on the carrier board 1 such that the membrane and the back plate of the chip 2 in the second region 23 are facing the opening 13 in the carrier board 1 and thus the opening 31 in the mounting layer 3.

As shown in the embodiment of FIG. 6, the openings 32, i.e., the opened contact holes, in the mounting layer 3 can serve as molds for an electrically conductive connection material 40 brought into said holes. The connection material 40 can preferably comprise or be a flexible adhesive filled with conductive particles, for example silver particles or carbon black particles, or an intrinsically conductive polymer. In particular, a relatively low Young's modulus of equal to or less than 300 MPa, and preferably of equal to or less than 100 MPa, is preferred. For instance, the connection material can be based on a silicone polymer.

FIG. 6 depicts the openings 32 with a partial filling of the connection material 40, wherein the filling is performed for example by dispensing, jetting, or pin transfer. The partial filling level is particularly advantageous, since, while a too low level cannot establish a conductive connection to the chip contact elements 24, a too high level may hinder proper containment inside the openings 32. Therefore, the chip contact elements 24 in the shown embodiment comprise stud bumps which are designed for dipping into the connection material 4o, which allows for a certain level tolerance. Alternatively, other conductive pillar structures can be used as well for the chip contact elements 24, wherein it is very advantageous if the outer diameter of the pillar structures is significantly smaller than the inner diameter of the openings 32, so that the level of the connection material 40 rises at a lower rate compared to the depth such pillar structure is submerged in it.

Figure 7:
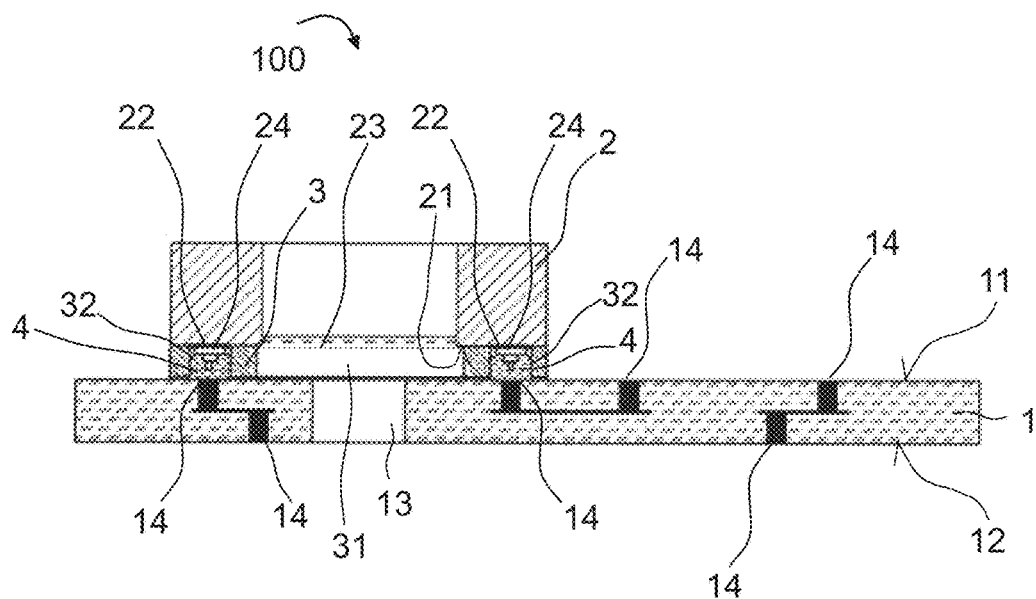

As shown in FIG. 7, the electronic chip 2 is arranged on the carrier board 1 so that the mounting side 21 of the electronic chip 2 faces the upper surface 11 of the carrier board 1 and the mounting layer 3 mounts the electronic chip 2 on the carrier board 1. In particular, a part of the mounting side 21 of the chip 2 is in direct contact with the mounting layer 3 so that the mounting layer 3 adheres to the mounting side 21. The connection material 40 can be cured so that connection elements 4 on the first regions 22 are formed.

As can be seen in FIG. 7, the flexible mounting layer 3 separates the second region 23 of the mounting side 21 of the electronic chip 2 from the connection elements 4 on the first regions 22. In particular, the material of the mounting layer 3 is arranged between the first regions 22 and the second region 23, acting as a barrier or dam and preventing the material of the connection elements 4 from spilling, squeezing, smearing or bleeding from the first regions 22 onto the second region 23 of the mounting side 21 during manufacture and in the finished electronic device 100. Particularly preferably, the second region 23 is surrounded by the by mounting layer 3. Accordingly, the mounting side 21 in the second region 23 is free of the material of the connection elements 4 and of the material of the mounting layer 3.

Figure 8:
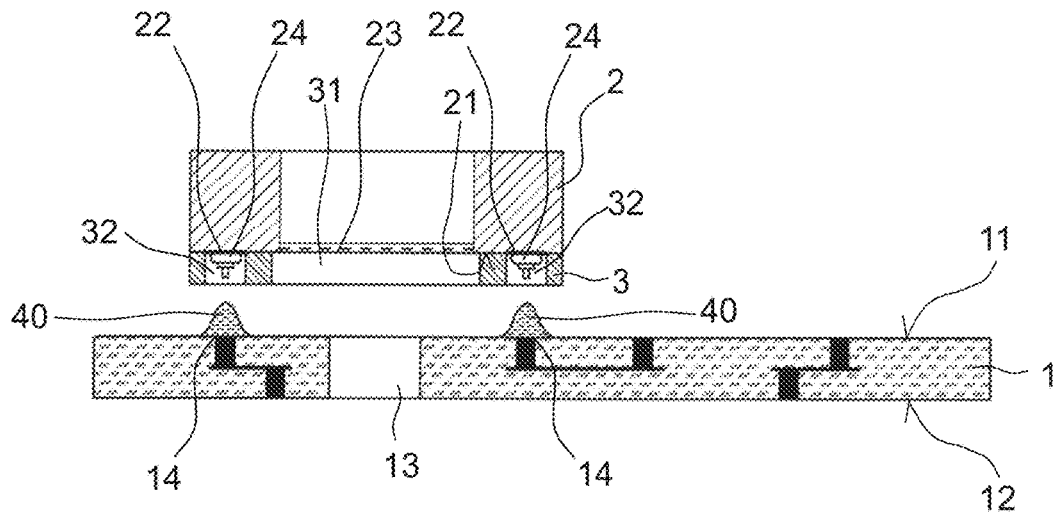
Figure 9:
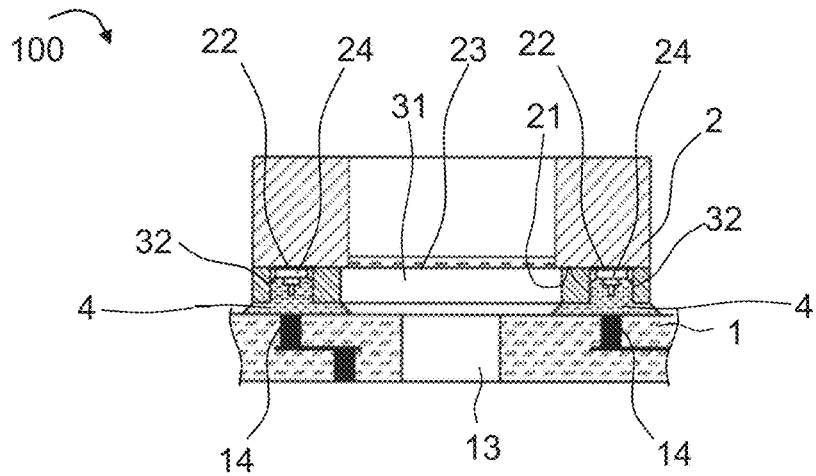

According to a further embodiment, as shown in FIG. 8, the mounting layer 3 is applied to the mounting side 21 of the electronic chip 2 before the chip 2 is mounted on the carrier board 1. Similar to the foregoing embodiments, the mounting layer 3 can be manufactured by applying and structuring a mounting material on the mounting side 21 or can be manufactured separately from the chip 2 and arranged on the mounting side 21. The connection material 40 is applied to the upper surface 11 of the carrier board 1. In particular, the connection material 40 is applied to the carrier contact elements 14 which are to be connected to the chip contact elements 24. Alternatively, the connection material 40 can also be applied to the chip carrier elements 24 in the openings 32 before the chip 2 with the mounting layer 3 is arranged on the carrier board 1.

After arranging the chip 2 with the mounting layer 3 as flexible assembly frame on the upper surface 11 of the carrier board 1, the openings 32 in the mounting layer 3 can be filled flush with the connection material and thus with the connection elements 4 as shown in FIG. 7. Consequently, the mounting layer 3 can be arranged directly on the mounting side 21 of the chip 2 and directly on the upper surface 11 of the carrier board 1. It can also be possible that the openings 32 are partly filled with the connection material and thus with the connection elements. Alternatively, the amount of the applied connection material 40 can be in excess in regard to the size of the openings 32, so that a part of the connection material and, thus, the connection elements 4, remains outside the openings 32 between the mounting layer 3 and the upper surface 11 of the carrier board 1. Consequently, the mounting layer 3 and thus the chip 2 can be mounted on the carrier board 1 also by means of the connection elements 4 as shown in a partial view of the electronic device 100 in FIG. 9.

Figure 10:
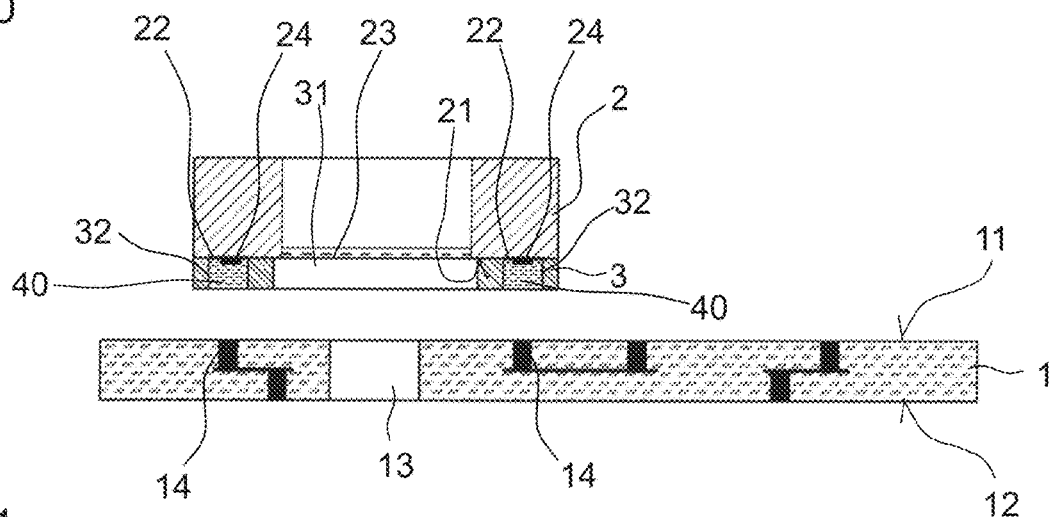
Figure 11:
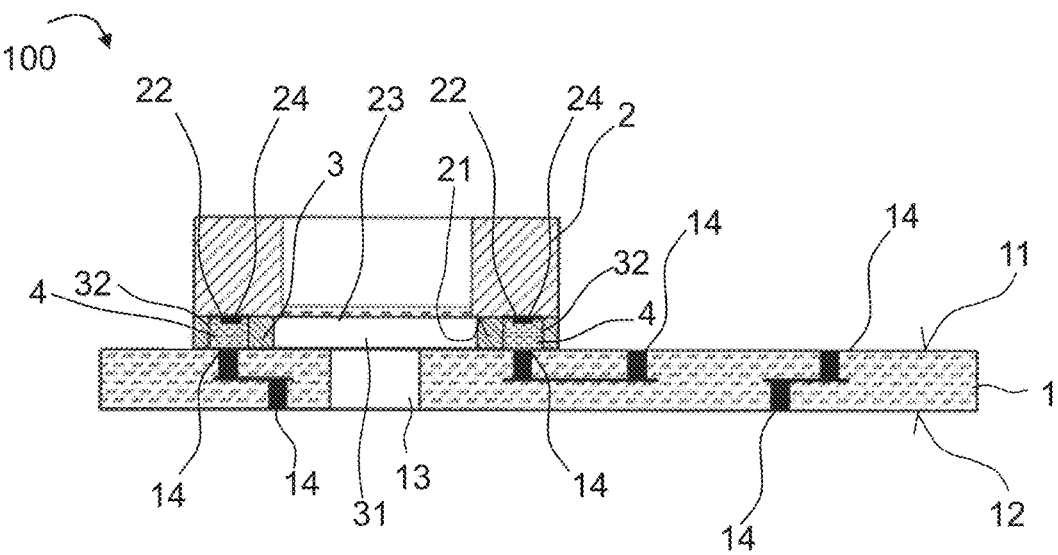
Figure 12:
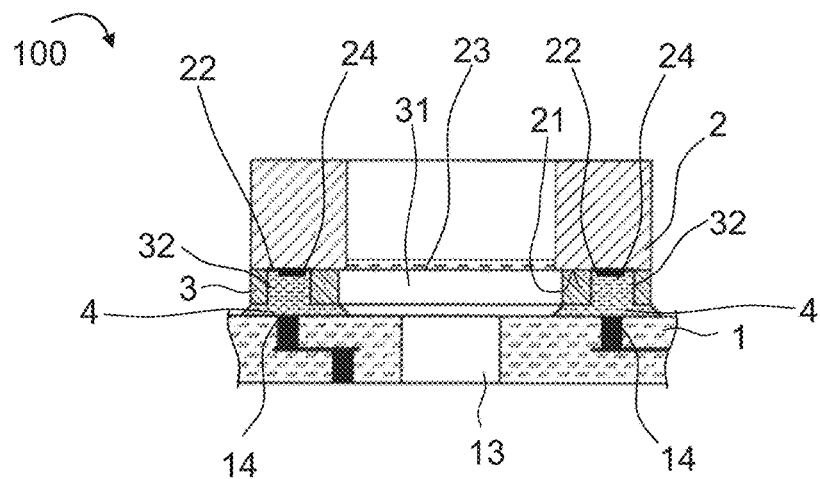

FIGS. 10, 11 and 12 show further embodiments, wherein the electronic chip 2 has chip contact elements 24 comprising contact pads rather than the stud bumps of the foregoing embodiments. As explained in connection with FIGS. 8 and 9, the mounting layer 3 is arranged on the mounting side 21 of the chip 2 before the chip 2 is arranged on the carrier board 1. Furthermore, the connection material 4o is applied to the openings 32 of the mounting layer 3 and thus to the chip contact elements 24 before the chip 2 is arranged on the carrier board 1. As shown in FIGS. 10 and 11, the amount of connection material can be adjusted so that the openings 32 in the mounting layer 3 are filled flush with the connection material 40 and thus with the connection elements 4. In particular in connection with a bump-less connection, i.e., without stud bumps, it can be advantageous to arrange the mounting layer 3 on the mounting side 21 of the chip 2, since on the side of the carrier board 1 some squeezing of the connection material can be tolerated. Moreover, the amount of connection material can exceed the volume of the openings 32 so that a part of the connection material remains outside the openings 32 between the mounting layer 3 and the upper surface 11 of the carrier board 1 as shown in FIG. 12. However, it is also possible with a bump-less connection that the mounting layer 3 is arranged on the carrier board 1 before the chip 2 is arranged on the carrier board 1 as explained in connection with FIGS. 1 to 7.

Figure 13:
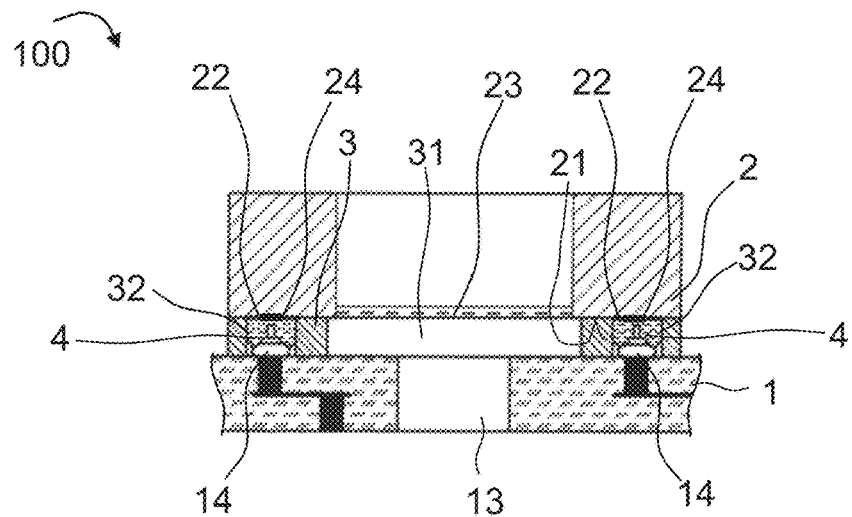

Furthermore, according to a further embodiment shown in FIG. 13 in a partial view of the electronic device 100, the carrier board 1 can have carrier contact elements 14 which comprise stud bumps or other pillar-like structures. Also in this case it can be preferable that the mounting layer 3 is arranged on the mounting side 21 of the chip 2 before the chip 2 is arranged on the carrier board 1 and that the connection material 40 is applied to the openings 32 of the mounting layer 3 and thus to the chip contact elements 24 before the chip 2 is arranged on the carrier board 1 as explained in connection with FIGS. 10 to 12.

FIGS. 14A to 14D show in top views the layout of the mounting layer 3 according to further embodiments. The black dots indicate possible positions of the chip contact elements and/or of the carrier contact elements. In order to optimize the compliance with the requirements of the electronic chip and, in particular, the electronic device, the footprint of the mounting layer 3 may be adjusted, thereby fulfilling the following requirements:

securely attaching the electronic chip to the carrier board;

in case of a microphone application providing an acoustic seal between the front and back side of the electronic chip, i.e., between the second region of the mounting side and the top side of the electronic chip; and providing a barrier or dam that keeps the connection material and, in particular, the connection elements, away from the second region of the mounting side of the electronic chip.

Figure 14A:
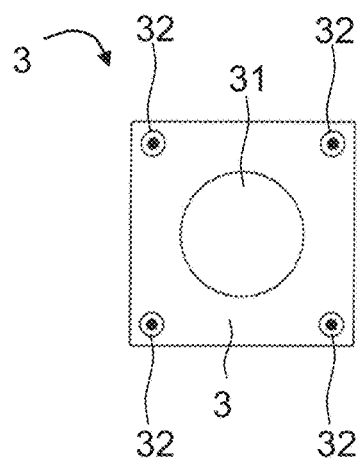
FIGS. 14A to 14D show schematic illustrations of features of a mounting layer for an electronic device according to further embodiments.
Figure 14B:
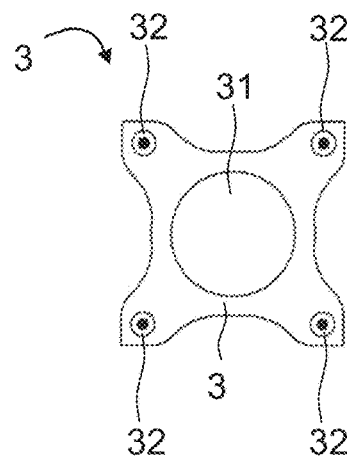
Figure 14C:
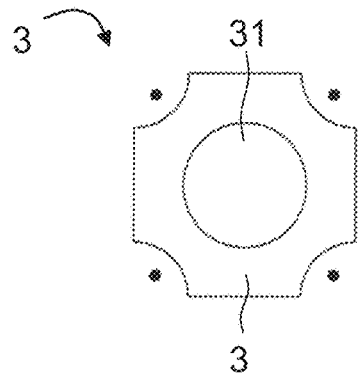
Figure 14D:
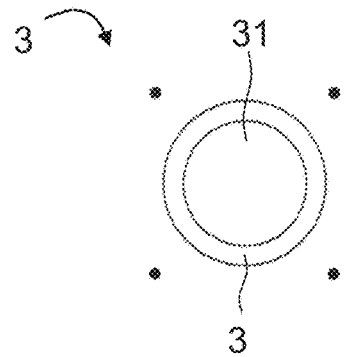

FIG. 14A shows the full area design as already shown in connection with the foregoing embodiments. According to the embodiment of FIG. 14B, the area of the mounting layer 3 is decreased, while the connection elements are still contained inside of the openings 32. In contrast, FIGS. 14C and 14D shown embodiments of the mounting layer 3, which have ring-like shapes, thereby resembling sealing rings. However, also in these embodiments a potential squeezing of the connection material towards the second region of the mounting side of the electronic chip located inside the opening 31 can be prevented and an acoustic seal can be ensured.

Figure 15:
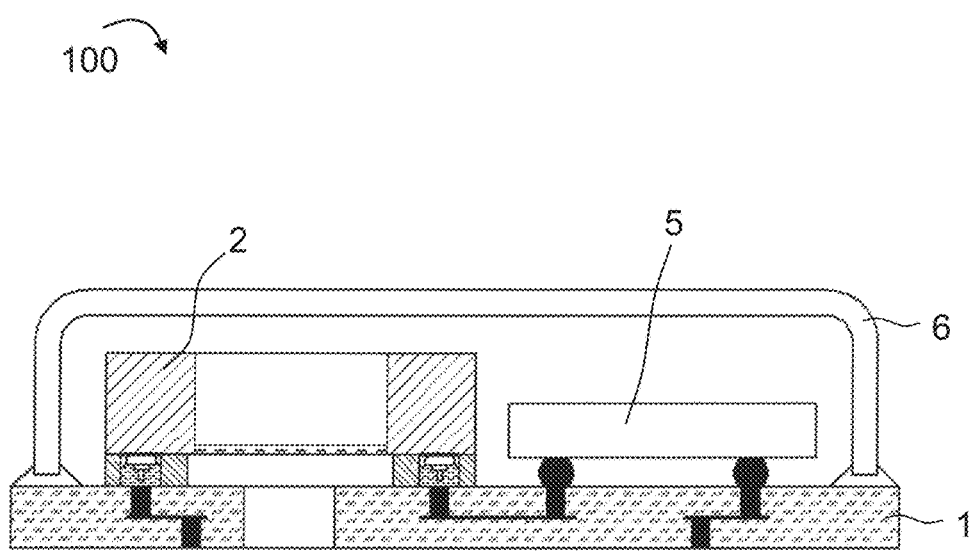
FIG. 15 shows a schematic illustration of an electronic device according to a further embodiment.

FIG. 15 shows a further embodiment of the electronic device 100, which, purely by example, comprises the carrier board 1, the electronic chip 2 and the mounting layer 3 with the connection elements 4 as explained in connection with FIGS. 1 to 7. Alternatively, the electronic device 100 shown in FIG. 15 can comprise any other feature described in connection with the foregoing embodiments. The electronic device wo further comprises additional circuitry in order to achieve a fully functional microphone. In particular, the electronic device wo can comprise an ASIC 5 for signal conditioning, mounted on the carrier board 1 in the same way as the electronic chip 2 or, as shown in FIG. 15, using solder bumps or any other assembly and interconnection method. Furthermore, the electronic device wo comprises a cap as a counterpart for the carrier board 1, for example a soldered metal cap, to complete the package housing.

Alternatively or additionally to the features described in connection with the Figures, the embodiments shown in the Figures can comprise further features described in the general part of the description. Moreover, features and embodiments of the Figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. An electronic device comprising:
a carrier board having an upper surface;
an electronic chip mounted on the upper surface of the carrier board, the electronic chip having a mounting side facing the upper surface of the carrier board;
a flexible mounting layer arranged between the upper surface of the carrier board and the mounting side of the electronic chip, the flexible mounting layer mounting the electronic chip to the carrier board,
wherein the mounting side has at least one first region and a second region, and
wherein the electronic chip has at least one chip contact element in the first region; and
at least one connection element arranged on the at least one first region and connecting the at least one chip contact element to the upper surface of the carrier board,
wherein the flexible mounting layer separates the second region from the connection element.

2. The electronic device according to claim 1, wherein the second region on the mounting side is surrounded by the mounting layer and is free of the at least one connection element and of the mounting layer.

3. The electronic device according to claim 1, wherein the connection element is arranged in an opening of the mounting layer.

4. The electronic device according to claim 1, wherein the mounting layer adheres to the mounting side of the electronic chip.

5. The electronic device according to claim 1, wherein the mounting layer adheres to the upper surface of the carrier board.

6. The electronic device according to claim 1, wherein the mounting layer comprises a polymer material.

7. The electronic device according to claim 6, wherein the polymer material is a silicone based polymer or a B-stage epoxy material or a C-stage epoxy material.

8. The electronic device according to claim 1, wherein the mounting layer has a thickness of equal to or greater than 10 μm and equal to or less than 500 μm.

9. The electronic device according to claim 1, wherein the connection element comprises an electrically conducting adhesive.

10. The electronic device according to claim 1, wherein, in a temperature range between at least −20° C. and 100° C. inclusive, the mounting layer has a Young's modulus of equal to or greater than 0.5 MPa and equal to or less than 100 MPa and the connection element has a Young's modulus of equal to or less than 300 MPa.

11. The electronic device according to claim 1, wherein, in a temperature range between at least −40° C. and 120° C. inclusive, the mounting layer has a Young's modulus of equal to or greater than 3 MPa and equal to or less than 30 MPa and the connection element has a Young's modulus of equal to or less than 100 MPa.

12. The electronic device according to claim 1, wherein the at least one chip contact element comprises a contact pad, a stud bump and/or a pillar-like structure.

13. The electronic device according to claim 1, wherein the carrier board has at least one carrier contact element that is connected to the at least one chip contact element by the connection element.

14. The electronic device according to claim 13, wherein the at least one carrier contact element comprises a contact pad, a stud bump and/or a pillar-like structure.

15. The electronic device according to claim 1, wherein the electronic chip is a MEMS chip.

16. The electronic device according to claim 1, wherein the electronic chip is mounted and fixed on the carrier board only or at least substantially by the mounting layer and the at least one connection element, and wherein any further underfill material is avoided.

17. A method for manufacturing the electronic device according to claim 1, the method comprising:
- providing the carrier board with the upper surface and the electronic chip with the mounting side with the at least one first region and the second region;
- applying a mounting material to the upper surface of the carrier board or to the mounting side of the electronic chip in a structured way to form the flexible mounting layer; and
- arranging a connection material on the upper surface of the carrier board or on the at least one first region of the electronic chip,
- wherein the electronic chip is arranged on the carrier board so that the mounting side of the electronic chip faces the upper surface of the carrier board and the mounting layer mounts the electronic chip on the carrier board, and
- wherein the connection material is cured to form the at least one connection element.

18. The method according to claim 17, wherein the mounting material is cured to form the mounting layer.

* * * * *